United States Patent [19]
Hull et al.

[11] Patent Number: 5,686,844
[45] Date of Patent: Nov. 11, 1997

[54] INTEGRATED CIRCUIT PINS CONFIGURABLE AS A CLOCK INPUT PIN AND AS A DIGITAL I/O PIN OR AS A DEVICE RESET PIN AND AS A DIGITAL I/O PIN AND METHOD THEREFOR

[75] Inventors: Richard L. Hull; Ryan Scott Ellison, both of Chandler, Ariz.

[73] Assignee: Microchip Technology Incorporated, Chandler, Ariz.

[21] Appl. No.: 644,915

[22] Filed: May 24, 1996

[51] Int. Cl.$^6$ .............................................. H03K 19/0175
[52] U.S. Cl. ............................................. 326/38; 326/46
[58] Field of Search ............................ 326/37-41, 46-47

[56] References Cited

U.S. PATENT DOCUMENTS 4,758,746  7/1988  Birkner et al. .................... 326/38 X
5,051,622  9/1991  Pleva ................................ 326/38
5,231,312  7/1993  Gongwer et al. ................. 326/38 X
5,473,758  12/1995 Allen et al. ...................... 365/52 X
5,594,442  1/1997  Paulos et al. .................... 341/143

*Primary Examiner*—David R. Hudspeth
*Attorney, Agent, or Firm*—Harry M. Weiss; Jeffrey D. Moy; Harry M. Weiss & Associates, P.C.

[57] ABSTRACT

The present invention relates to a configurable IC device pin. The IC device pin may be a device clock input pin or a digital I/O pin in one embodiment of the present invention, or a reset pin or a digital I/O pin in another embodiment of the present invention. Both embodiments of the present invention use a memory device to store information to configure the IC device pin. Input/Output logic is also used in both embodiments in order to transfer data to and from the IC device pin when the IC device pin is configured as a digital I/O pin.

24 Claims, 3 Drawing Sheets

INTEGRATED CIRCUIT PINS CONFIGURABLE AS A CLOCK INPUT PIN AND AS A DIGITAL I/O PIN OR AS A DEVICE RESET PIN AND AS A DIGITAL I/O PIN AND METHOD THEREFOR

BACKGROUND OF THE INVENTION

1. Field of the Invention

This invention relates to integrated circuit (IC) devices and, more specifically, to a configurable IC device pin. In accordance with one embodiment of the present invention, the IC device pin may be configured as a clock input pin or as a digital input/output (I/O) pin. In another embodiment of the present invention, the IC device pin may be configured as a device reset pin or as a digital I/O pin.

2. Description of the Prior Art

In the past, most IC devices are designed with a dedicated pin configuration. That is to say that each pin on the IC device is dedicated to a specific individual function. For example, IC devices may have dedicated pins for power supply, ground, clock input, clock output, IC device reset, and data I/O. The problem with having a dedicated pin configuration is that it limits the functionality of the IC device. This is particularly a limitation with IC devices that have a low pin count.

In many applications, the IC device pin does not have the function in its dedicated manner. Therefore, by reconfiguring the IC device pin to function in a different manner, the flexibility and the functionality of the IC device will increase. Presently, many IC devices have been designed with multiple function device pins. However, most of these IC devices still have dedicated clock input pins and dedicated device reset pins. These IC device pins (i.e. the dedicated clock input pins and the dedicated device reset pins) could be reconfigured to function as an additional digital I/O pin when the reset pin or the clock input pin is not required.

Therefore, a need existed to provide a configurable pin for IC devices. The configurable pin would function as a device reset pin or a digital I/O pin based on the needs of the IC device. In accordance with another embodiment of the present invention, the configurable pin would function as a clock input pin or a digital I/O pin based on the application of the IC.

SUMMARY OF THE INVENTION

In accordance with one embodiment of the present invention, it is an object of the present invention to provide a configurable pin for IC devices and method therefor that would function as a device reset pin or as a digital I/O pin based on the needs of the IC device.

It is still another object of the present invention to provide a configurable pin for IC devices and method therefor that would function as a clock input pin or as a digital I/O pin based on the application of the IC.

BRIEF DESCRIPTION OF THE PREFERRED EMBODIMENTS

In accordance with one embodiment of the present invention a system for configuring an IC device pin as a clock input pin or as a digital I/O pin is disclosed. The system is comprised of an IC device pin. Memory means are provided for storing a value to configure the IC device pin as a clock input pin and for storing a value to configure the IC device pin as a digital I/O pin. Input/Output logic means are coupled to an output of the memory means for writing data out of the IC device pin and for reading data in from the IC device pin when the IC device pin is configured as a digital I/O pin. Clock logic gate means are coupled to the output of the memory means and to the IC device pin for outputting a clock signal for the IC device when the IC device pin is configured as a clock input pin.

In accordance with another embodiment of the present invention, a system for configuring an IC device pin as a device reset pin or as a digital I/O pin is disclosed. The system is comprised of an IC device pin. Memory means are provided for storing a value to configure the IC device pin as a device reset pin and for storing a value to configure the IC device pin as a digital I/O pin. Input/Output logic means are coupled to an output of the memory means for writing data out of the IC device pin and for reading data in from the IC device pin when the IC device pin is configured as a digital I/O pin. Device reset logic gate means are coupled to the output of the memory means and to the IC device pin for outputting a reset signal when the IC device pin is configured as a device reset pin.

In accordance with another embodiment of the present invention, a method of providing a system for configuring an IC device pin as a clock input pin or as a digital I/O pin is disclosed. The method comprises the steps of: providing an IC device pin; providing memory means for storing a value to configure the IC device pin as a clock input pin and for storing a value to configure the IC device pin as a digital I/O pin providing I/O logic means coupled to an output of the memory means for writing data out of the IC device pin and for reading data in from the IC device pin when the IC device pin is configured as a digital I/O pin; providing clock logic gate means coupled to the output of the memory means and to the IC device pin for outputting a clock signal when the IC device pin is configured as a clock input pin; and providing bus means coupled to the I/O logic means for transferring data to and from the I/O logic means when the IC device pin is configured as a digital I/O pin.

In accordance with another embodiment of the present invention, a method of providing a system for configuring an IC device pin as a device reset pin or as a digital I/O pin is disclosed. The method comprises the steps of: providing an IC device pin; providing memory means for storing a value to configure the IC device pin as a device reset pin and for storing a value to configure the IC device pin as a digital I/O pin; providing I/O logic means coupled to an output of the memory means for writing data out of the IC device pin and for reading data in from the IC device pin when the IC device pin is configured as a digital I/O pin; providing device reset logic gate means coupled to the output of the memory means and to the IC device pin for outputting a reset signal when the IC device pin is configured as a device reset pin; and providing bus means coupled to the I/O logic means for transferring data to and from the I/O logic means when the IC device pin is configured as a digital I/O pin.

The foregoing and other objects, features, and advantages of the invention will be apparent from the following, more particular, description of the preferred embodiments of the invention, as illustrated in the accompanying drawing.

DETAILED DESCRIPTION OF THE PREFERRED EMBODIMENT

Figure 1:
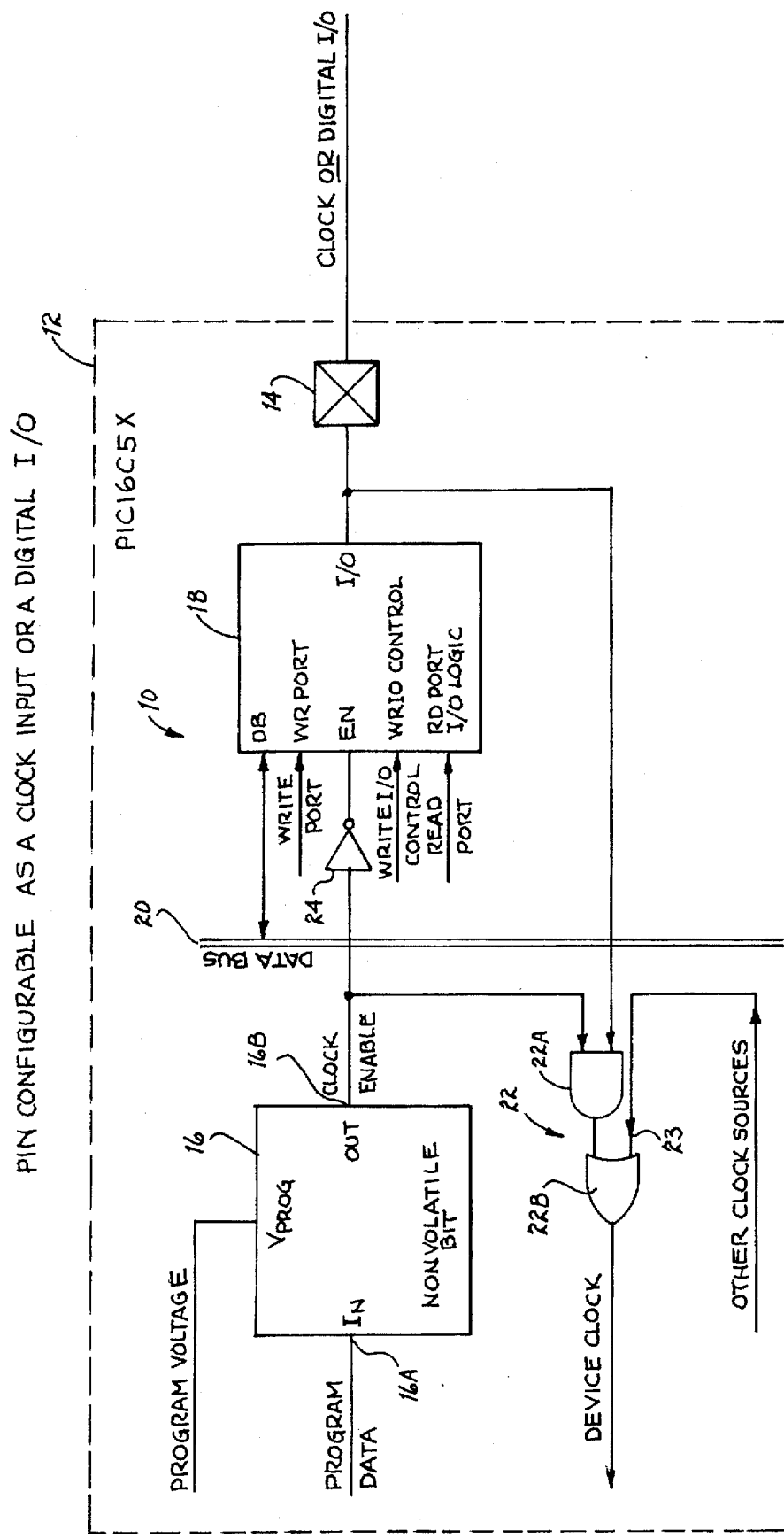
FIG. 1 is a simplified functional block diagram of an IC device pin configurable as a clock input pin or as a digital I/O pin.

Referring to FIG. 1, a system for configuring IC device pins as a block input pin or as a digital I/O pin (hereinafter system 10) is shown. The system 10 may be used for any type of IC device 12 that requires a clock input pin and a digital I/O pin such as a PIC16C5X type microcontroller produced by MICROCHIP TECHNOLOGY, INC.

The system 10 is comprised of an IC device pin 14. A memory system 16 is provided for storing a value to configure the IC device pin 14 as a clock input pin and for storing a value to configure the IC device pin 14 as a digital I/O pin. In the preferred embodiment of the present invention, the memory system 16 is a nonvolatile memory bit. An example of a nonvolatile memory bit is an erasable programmable read only memory (EPROM) bit. The memory system 16 may also use a volatile memory bit. However, the volatile memory bit must have a set known value upon power up of the system 10.

Input/Output (I/O) logic 18 is coupled to an output 16B of the memory system 16. The I/O logic 18 is used for writing data out of the IC device pin 14 and for reading data in from the IC device pin 14 when the IC device pin 14 is configured as a digital I/O pin, the data is transferred to and from the I/O logic 18 through a data bus 20 which is directly coupled to the I/O logic 18.

Clock logic gate circuitry 22 is coupled to the output 16B of the memory system 16 and to the IC device pin 14. The clock logic gate circuitry 22 is used for outputting a clock signal when the IC device pin 14 is configured as a clock input pin. In the preferred embodiment of the present invention, the clock logic circuitry is comprised of an AND gate 22A having an input coupled to the output 16B of the memory system 16 and having another input coupled to the IC device pin 14, and an OR gate 22B having an input coupled to an output of the AND gate 22A and another input 24 coupled to other clock sources that may be internal or external to the IC device 12.

Figure 2:
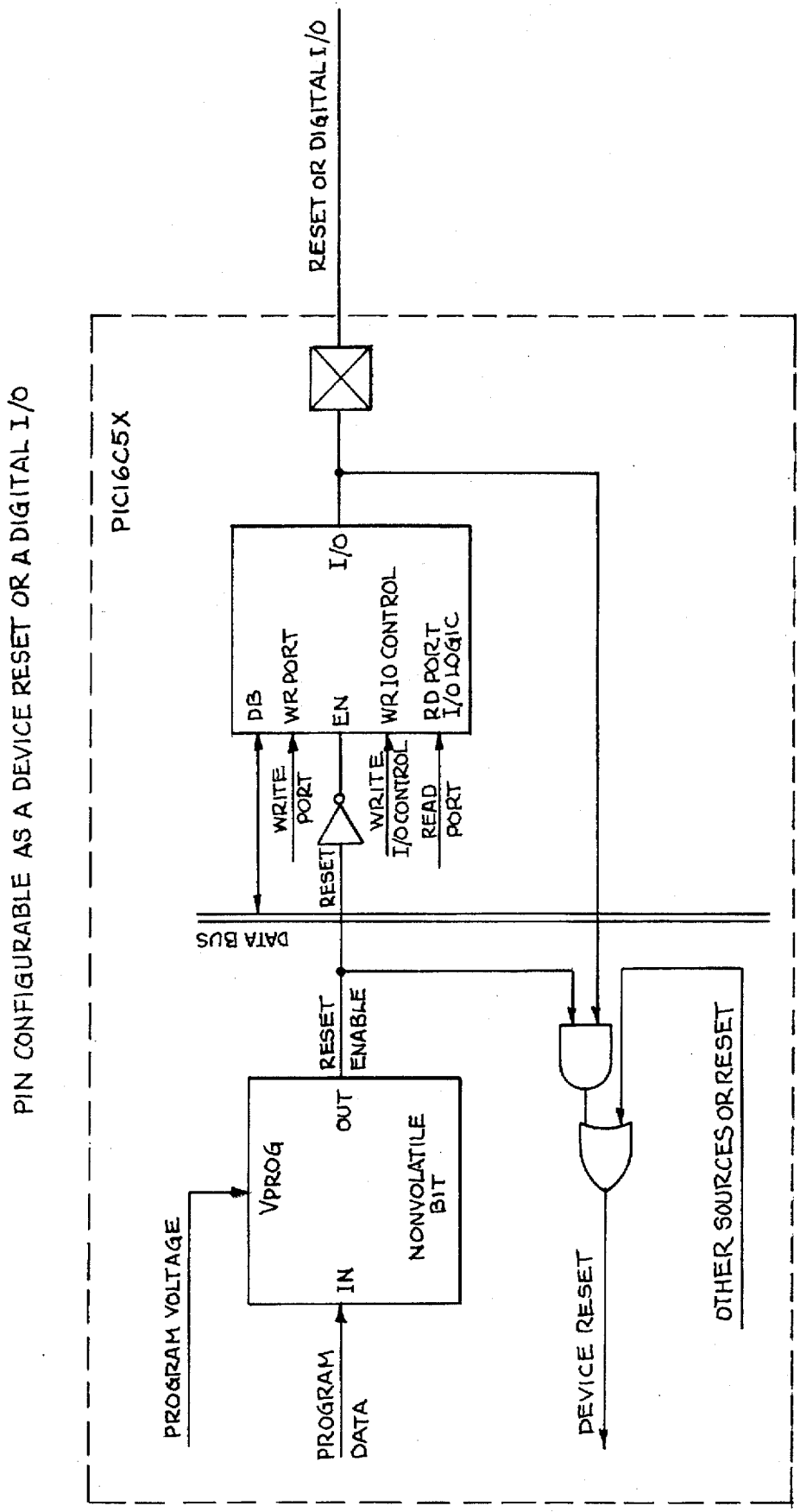
FIG. 2 is a simplified functional block diagram of an IC device pin configurable as a device reset pin or as a digital I/O pin.

Referring to FIG. 2, another embodiment of the present invention is shown wherein like numerals and symbols represent like elements with the exception of a "'" which denotes the alternative embodiment. In this embodiment, the system 10' is used for configuring an IC device pin 14' on the IC device 12' as a device reset pin or as a digital I/O pin.

The system 10' is comprised of a majority of the same elements used in the embodiment depicted in FIG. 1. Each of the elements in the system 10' which are similar to the elements used in the system 10 of FIG. 1 also function in a similar manner to the elements used in the system 10. Thus, the system 10' is comprised of an IC device pin 14', memory system 16' having an input 16A' and and output 16B', I/O logic 18', and a data bus 20'.

The system 10' does differ from the system 10 of FIG. 1 in that the clock logic gate circuitry 22 of system 10 has been replaced with device reset logic gate circuitry 30'. The device reset logic gate circuitry 30' is coupled to an output 16B' of the memory system 16' and to the IC device pin 14'. The device reset logic gate circuitry 30' is used for outputting a reset signal when the IC device pin 14' is configured as a device reset pin. The device reset logic circuitry is comprised of an AND gate 30A' having an input coupled to the output 16B' of the memory system 16' and having another input coupled to the IC device pin 14', and an OR gate 30B' having an input coupled to an output of the AND gate 30' and having another input 32' coupled to other sources of reset.

OPERATION

Figure 3:
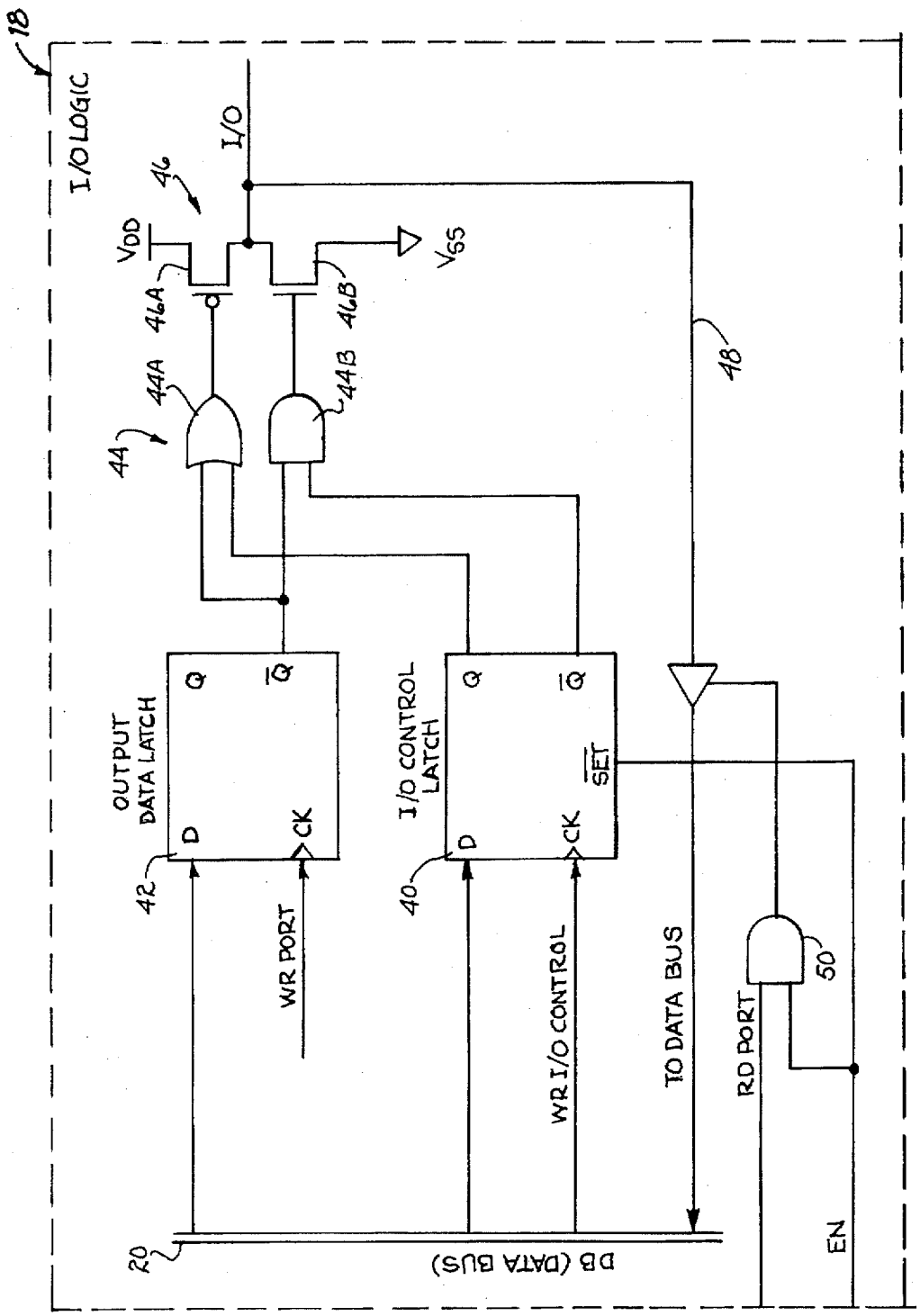
FIG. 3 is a simplified functional block diagram of the I/O logic used in the two embodiments of the present invention shown in FIGS. 1 and 2.

Referring now to FIGS. 1 and 3, the operation of the systems 10 will be discussed. The memory system 16 will receive program data through its input 16A. The program data will set the IC device pin 14 as a clock input pin or as a digital I/O pin. The program data will either be a high value "1" or a low value "0". When a "1" is inputted to the memory system 16, the IC device pin 14 is configured as a clock input pin. The memory system 16 will output a "1" at its output 16B and the inverter 24 will invert the high signal "1" signal to a low signal "0". The low signal "0" will in turn disable the I/O logic 18. With the I/O logic 18 disabled, when the IC device pin 14 goes high, the output of the AND gate 22A will go high causing the output of the OR gate 22B to go high. Thus, an external clock signal that is coupled to the IC device pin 14 will be outputted through the OR gate 22B to components in the IC device 12 that requires a clock signal to operate. It should be noted that another input 24 to the OR gate 22B is coupled to other clock source signals. These other clock source signals may be internal or external to the IC device 12. When the IC device pin 14 is configured as a digital I/O pin, the clock logic gate circuitry 22 may still send out a clock signal. However, the clock signal sent from the OR gate 22B has to come from the one of the other clock source signals that may be sent through input 24 of the OR gate 22B. For most IC devices 12 and applications, only one clock source is active.

When a low value "0" is inputted to the memory system 16, the IC device pin 14 is configured as a digital I/O pin. The memory system 16 will output a low signal "0" at its output 16B and the inverter 24 will invert the low signal "0" signal to a high signal "1". The high signal "1" will enable the I/O logic 18.

Referring to FIG. 3, a functional block diagram of the I/O logic 18 is shown. The I/O logic 18 is comprised of an I/O control latch 40. The I/O control latch 40 is coupled to the data bus 20 for setting the digital I/O pin as an input pin (i.e., read data in from the IC device pin 14) or as an output pin (i.e., write data out of the IC device pin 14). An output data latch 42 is also coupled to the data bus 20. The output data latch 42 is used for clocking in data from the data bus 20 to be written out of the digital I/O pin when the digital I/O pin is configured as an output pin.

The I/O logic 18 is further comprised of a logic gate circuit 44. The logic gate circuit 44 is coupled to the output data latch 42 and to the I/O control latch 40. The logic gate circuit 44 is used for signaling the output driver 46 when to output the digital data. The logic gate circuit 44 is comprised of an OR gate 44A and an AND gate 44B. The OR gate 44A has an input coupled to an inverted output $\overline{Q}$ of the output data latch 42 and another input coupled to an output Q of the I/O control latch 40. The AND gate 44B has an input coupled to the inverted output $\overline{Q}$ of the output data latch 42 and another input coupled to an inverted output $\overline{Q}$ of the I/O control latch 40.

As stated above, output driver circuit 46 is coupled to the logic gate circuit 44. The output driver circuit 46 is used for outputting the digital data. The output driver 46 is comprised of a PMOS transistor 46A having a gate coupled to an output of the OR gate 44A, and an NMOS transistor 46B having a gate coupled to an output of the AND gate 44B.

When the I/O logic 18 is enabled, the IC device pin 14 is configured as a digital I/O pin. In order to read from the digital I/O pin (i.e. input data from the digital I/O pin), the I/O control latch 40 must set the IC device pin 14 as an input pin. A read signal then must be inputted to the AND gate 50 of the I/O logic 18. The signal which enables the I/O logic 18 must also be inputted to the AND gate 50. This will allow data to be transferred directly from the IC device pin 14 to the data bus 20 through data line 48.

In order to write data to the digital I/O pin (i.e. output data to the digital I/O pin), the I/O control latch 40 must set the IC device pin 14 as an output in (Q=0). The output latch 42 will then clock in the data to be transfer from the data bus 20 through the WR PORT 42A. If the data in the output data latch is a 1, the inverted output $\overline{Q}$ of the output data latch 42 will be a 0. Since the digital I/O pin is configured as an output pin, the output Q of the I/O control latch 40 will be a 0. Thus, the output of the OR gate 44A will be a 0 enabling the PMOS transistor 46A. This will pull the output pin high which is positive with respect to what is stored in the output data latch 42 (i.e., the output pin will output a 1). If the data in the output data latch is a 0, the inverted output $\overline{Q}$ of the output data latch 42 will be a 1. Since the digital I/O pin is configured as an output pin, the inverted output $\overline{Q}$ of the I/O control latch 40 will be also a 1 (i.e., Q=0 to set the IC device pin 14 as an output pin). Thus, the output of the AND gate 44B will be a 1 enabling the NMOS transistor 46B. This will pull the digital I/O pin to 0 (i.e., the output pin will output a 0).

Referring now to FIG. 2, the system 10' will function in much the same manner as the system 10 depicted in FIG. 1. When the IC device pin 14' is configured as a digital I/O pin, the system 10' will function in the exact same manner as described above for the system 10 (FIG. 1). However, when a high value "1" is inputted to the memory system 16', the IC device pin 14 is configured as a device reset pin. The memory system 16' will output a high signal "1" at its output 16B' and the inverter 24' will invert the high signal "1" signal to a low signal "0". The low signal "0" will disable the I/O logic 18'. With the I/O logic 18' disabled, when the IC device pin 14' goes high, the output of the AND gate 30A' will go high causing the output of the OR gate 30B' to go high. Thus, the high signal from the IC device pin 14' will cause a reset signal to be outputted from the OR gate 30B' to internal portions of the IC device 12' which need to be reset. For example, the signal line could be coupled to the CPU, registers, modules, counters, etc. It should be noted that another input 32' to the OR gate 30B' is coupled to other sources of reset. These other sources of reset are also used to cause a reset signal to be outputted from the OR gate 30B' to internal portions of the IC device 12' which need to be reset. When the IC device pin 14 is configured as a digital I/O pin, the device reset logic gate circuitry 30' may still send out a reset signal. However, the only sources of reset have to come from the other sources of reset sent through input 32' of the OR gate 30B'. This input 32' is needed because multiple sources of reset may be required for many applications and on many IC devices.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A system for configuring an integrated circuit (IC) device pin as a clock input pin and as a digital input/output (I/O) pin comprising, in combination:

an IC device pin;

memory means for storing a value to configure said IC device pin as said clock input pin and for storing a value to configure said IC device pin as said digital I/O pin;

I/O logic means coupled to an output of said memory means for writing data out of said IC device pin and for reading data in from said IC device pin when said IC device pin is configured as said digital I/O pin; and clock logic gate means coupled to said output of said memory means and to said IC device pin for outputting a clock signal to an IC device coupled to said IC device pin when said IC device pin is configured as said clock input pin.

2. The system in accordance with claim 1 further comprising bus means coupled to said I/O logic means for transferring data to and from said I/O logic means when said IC device pin is configured as said digital I/O pin.

3. The system in accordance with claim 1 wherein said memory means is a nonvolatile memory bit.

4. The system in accordance with claim 3 wherein said nonvolatile memory bit is an erasable programmable read only memory (EPROM) bit.

5. The system in accordance with claim 1 said memory means is a volatile memory bit that has a set known value upon power up of said system.

6. The system in accordance with claim 2 wherein said I/O logic means comprises:

I/O control latch means coupled to said bus means for sending a signal to set said digital I/O pin as an input pin and for sending a signal to set said digital I/O pin as an output pin;

output data latch means coupled to said but means for clocking in data from said bus means to be written out of said digital I/O pin when said digital I/O pin is configured as said output pin;

logic gate circuit means coupled to said output data latch means and to said I/O control latch means for signalling when said data is to be written to said output pin;

output driver circuit means coupled to said logic gate circuit means for outputting said data; and logic gate means having an output coupled to said IC device pin and an input coupled to a read enable signal for transferring data inputted to said digital I/O pin to said bus means when said digital I/O pin is configured as said input pin.

7. The system in accordance with claim 6 wherein said logic gate circuit means comprises:

an OR gate having an input coupled to an inverted output of said output data latch means and another input coupled to an output of said I/O control latch means; and an AND gate having an input coupled to said inverted output of said output data latch means and another input coupled to an inverted output of said I/O control latch means.

8. The system in accordance with claim 8 wherein said output driver circuit means comprises:

a PMOS transistor having a gate coupled to an output of said OR gate; and an NMOS transistor having a gate coupled to an output of said AND gate.

9. The system in accordance with claim 1 wherein said clock logic means comprises:

an AND gate having an input coupled to said output of said memory means and having another input coupled to said IC device pin; and an OR gate having an input coupled to an output of said AND gate.

10. A system for configuring an IC device pin as a device reset pin and as a digital I/O pin comprising, in combination:

an IC device pin;

memory means for storing a value to configure said IC device pin as said device reset pin and for storing a value to configure said IC device pin as said digital I/O pin;

I/O logic means coupled to an output of said memory means for writing data out of said IC device pin and for reading data in from said IC device pin when said IC device pin is configured as said digital I/O pin; and device reset logic gate means coupled to said output of said memory means and to said IC device pin for outputting a reset signal when said IC device pin is configured as said device reset pin.

11. The system in accordance with claim 10 further comprising bus means coupled to said I/O logic means for transferring data to and from said I/O logic means when said IC device pin is configured as said digital I/O pin.

12. The system in accordance with claim 10 wherein said memory means is a nonvolatile memory bit.

13. The system in accordance with claim 12 wherein said nonvolatile memory bit is an erasable programmable read only memory (EPROM) bit.

14. The system in accordance with claim 10 said memory means is a volatile memory bit that has a set known value upon power up of said system.

15. The system in accordance with claim 11 wherein said I/O logic means comprises:

I/O control latch means coupled to said bus means for sending a signal to set said digital I/O pin as an input pin and for sending a signal to set said digital I/O pin as an output pin;

output data latch means coupled to said bus means for clocking in data from said bus means to be written out of said digital I/O pin when said digital I/O pin is configured as said output pin;

logic gate circuit means coupled to said output data latch means and to said I/O control latch means for signalling when said data is to be written to said output pin;

output driver circuit means coupled to said logic gate circuit means for outputting said data; and logic gate means having an output coupled to said IC device pin and an input coupled to a read enable signal for transferring data inputted to said digital I/O pin to said bus when said digital I/O pin is configured as said input pin.

16. The system in accordance with claim 15 wherein said logic gate circuit means comprises:

an OR gate having an input coupled to an inverted output of said output data latch means and another input coupled to an output of said I/O control latch means; and an AND gate having an input coupled to said inverted output of said output data latch means and another input coupled to an inverted output of said I/O control latch means.

17. The system in accordance with claim 16 wherein said output driver circuit means comprises:

a PMOS transistor having a gate coupled to an output of said OR gate; and an NMOS transistor having a gate coupled to an output of said AND gate.

18. The system in accordance with claim 10 wherein said device reset logic means comprises:

an AND gate having an input coupled to said output of said memory means and having another input coupled to said IC device pin; and an OR gate having an input coupled to an output of said AND gate and having another input coupled to other sources of reset for an IC device coupled to said IC device pin.

19. A method of providing a system for configuring an IC device pin as a clock input pin and as a digital I/O pin comprising the steps of:

providing an IC device pin;

providing memory means for storing a value to configure said IC device pin as said clock input pin and for storing a value to configure said IC device pin as said digital I/O pin;

providing I/O logic means coupled to an input of said memory means for writing data out of said IC device pin and for reading data in from said IC device pin when said IC device pin is configured as said digital I/O pin;

providing clock logic gate means coupled to said output of said memory means and to said IC device pin for outputting a clock signal when said IC device pin is configured as said clock input pin; and providing bus means coupled to said I/O logic means for transferring data to and from said I/O logic means when said IC device pin is configured as said digital I/O pin.

20. The method of claim 19 wherein said step of providing I/O logic means further comprises the steps of:

providing I/O control latch means coupled to said bus means for sending a signal to set digital I/O pin as an input pin and for sending a signal to set said digital I/O pin as an output pin;

providing output data latch means coupled to said bus means for clocking in data from said bus means to be written out of said digital I/O pin when said digital I/O pin is configured as said output pin;

providing logic gate circuit means coupled to said output data latch means and to said I/O control latch means for signalling when said data is to be written to said output pin;

providing output driver circuit means coupled to said logic gate circuit means for outputting said data; and providing AND gate means having an output coupled to said IC device pin and an input coupled to a read enable signal for transferring data inputted to said digital I/O pin to said bus when said digital I/O pin is configured as said input pin.

21. The method of claim 19 wherein the step of providing clock logic means further comprises the steps of:

providing an AND gate having an input coupled to said output of said memory means and having another input coupled to said IC device pin; and providing an OR gate having an input coupled to an output of said AND gate.

22. A method of providing a system for configuring an IC device pin as a device reset pin and as a digital I/O pin comprising the steps of:

providing an IC device pin;

providing memory means for storing a value to configure said IC device pin as said device reset pin and for storing a value to configure said IC device pin as said digital I/O pin;

providing I/O logic means coupled to an output of said memory means for writing data out of said IC device pin and for reading data in from said IC device pin when said IC device pin is configured as said digital I/O pin;

providing device reset logic gate means coupled to said output of said memory means and to said IC device pin for outputting a reset signal when said IC device pin is configured as said device reset pin; and providing bus means coupled to said I/O logic means for transferring data to and from said I/O logic means when said IC device pin is configured as said digital I/O pin.

23. The method of claim 22 wherein said step of providing I/O logic means further comprises the steps of:

providing I/O control latch means coupled to said bus means for sending a signal to set said digital I/O pin as an input pin and for sending a signal to set said digital I/O pin as an output pin;

providing output data latch means coupled to said bus means for clocking in data from said bus means to be written out of said digital I/O pin when said digital I/O pin is configured as said output pin;

providing logic gate circuit means coupled to said output data latch means and to said I/O control latch means for signalling when said data is to be written to said output pin;

providing output driver circuit means coupled to said logic gate circuit means for outputting said data; and providing logic means having an output coupled to said IC device pin and an input coupled to a read enable signal for transferring data inputted to said digital I/O pin to said bus when said digital I/O pin is configured as said input pin.

24. The method of claim 22 wherein said step of providing device reset logic means further comprises the steps of:

providing an AND gate having an input coupled to said output of said memory means and having another input coupled to said IC device pin; and providing an OR gate having an input coupled to an output of said AND gate and having another input coupled to other sources of reset for an IC device coupled to said IC device pin.

\* \* \* \* \*

UNITED STATES PATENT AND TRADEMARK OFFICE
CERTIFICATE OF CORRECTION

PATENT NO : 5,686,844

DATED : November 11, 1997

INVENTOR(S): Richard L. Hull; Ryan Scott Ellison

It is certified that error appears in the above-identified patent and that said Letters Patent is hereby corrected as shown below:

Column 6, Claim 6, line 32, delete "but" and insert --bus--.

Column 6, Claim 8, line 57, delete "claim 8" and insert --claim 7--

Signed and Sealed this

Twelfth Day of January, 1999

Attest:

Attesting Officer  *Acting Commissioner of Patents and Trademarks*